United States Patent [19]

Tserng

[11] Patent Number: 5,683,919
[45] Date of Patent: Nov. 4, 1997

[54] TRANSISTOR AND CIRCUIT INCORPORATING SAME

[75] Inventor: Hua Quen Tserng, Dallas, Tex.

[73] Assignee: Texas Instruments Incorporated, Dallas, Tex.

[21] Appl. No.: 473,623

[22] Filed: Jun. 7, 1995

Related U.S. Application Data

[62] Division of Ser. No. 339,043, Nov. 14, 1994.

[51] Int. Cl.$^6$ ............. H01L 21/265; H01L 21/20; H01L 21/324; H01L 21/44
[52] U.S. Cl. ............. 437/31; 437/126; 437/203; 437/248; 437/902
[58] Field of Search ............. 333/246, 247; 437/921, 927, 31, 182, 126, 203, 902; 257/197, 198, 728

[56] References Cited

U.S. PATENT DOCUMENTS

| | | | |
|---|---|---|---|
| 2,967,344 | 1/1961 | Mueller | 437/203 |
| 3,609,473 | 9/1971 | Bittmann | 257/728 |
| 5,122,856 | 6/1992 | Komiya | 357/55 |
| 5,147,775 | 9/1992 | Ota et al. | 437/31 |
| 5,202,752 | 4/1993 | Honjo | 333/246 |
| 5,319,237 | 6/1994 | Legros | 437/182 |
| 5,422,615 | 6/1995 | Shibagaki et al. | 257/728 |
| 5,449,930 | 9/1995 | Zhou | 257/197 |
| 5,511,428 | 4/1996 | Goldberg et al. | 73/777 |

*Primary Examiner*—John Niebling
*Assistant Examiner*—Brian K. Dutton
*Attorney, Agent, or Firm*—Christopher L. Maginniss; W. James Brady, III; Richard L. Donaldson

[57] ABSTRACT

A flip-chip integrated circuit having a transistor 300 with terminals 314, 312, 320 contacted from opposite sufaces of a semiconductor substrate 302. The terminals contacted from opposite surfaces of the substrate may be vertically aligned. The active devices may also be etched or implanted to reduce parasitic capacitances and therefore improve transistor performance.

6 Claims, 9 Drawing Sheets

TRANSISTOR AND CIRCUIT INCORPORATING SAME

RELATED APPLICATIONS

This is a divisional of application Ser. No. 08/339,043, filed Nov. 14, 1994.

This application includes subject matter which is related to U.S. patent application Ser. No. 08/159,648, "Low Thermal Impedance Integrated Circuit," (Texas Instruments, Inc., Docket No. TI-18439), filed Nov. 30, 1993, and U.S. patent application Ser. No. 08/298,822, "High Density Integrated Circuit," (Texas Instruments, Inc. Docket No. TI-18486, filed Aug. 08, 1994.

FIELD OF THE INVENTION

This invention generally relates to semiconductor integrated circuits, and more specifically to high density, low-thermal-impedance, structures and methods of fabrication.

BACKGROUND OF THE INVENTION

The continual demand for high performance integrated circuits in smaller chip areas has resulted in downsizing transistor dimensions and increasing operating power densities. This leads to heat dissipation problems, especially for GaAs-based circuits since GaAs has only one-third the thermal conductivity of silicon. One solution to the thermal problem is a flip-chip approach where the substrate on which the circuit is fabricated is "flipped," and the circuit side is bonded directly to a heatsink/groundplane. This removes the problem of having the substrate, with its poor thermal conductivity, between the circuit and the heatsink.

Flip-chip bonding for integrated circuits allows for a higher density of interconnection with less parasitic impedances than with traditional wire bonding and tape automated bonding. In flip-chip bonding, solder bumps on the bonding pads on the frontside of a die are aligned with solder-wettable metallization on a carrier substrate, and a solder reflow forms all of the solder bonds simultaneously. In contrast to wire bonding, the flip-chip bond pads may be located anywhere on the frontside of a die and thus simplify integrated circuit layout.

Figure 1:
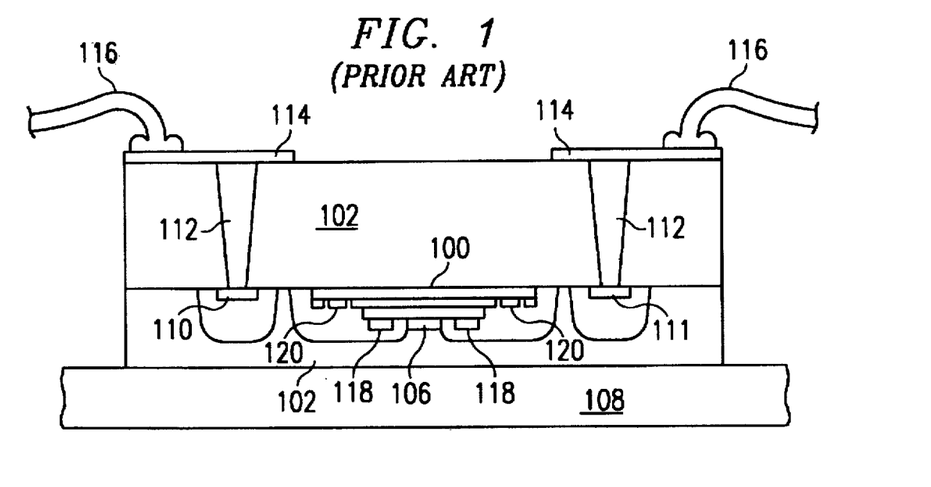
FIG. 1 is a cross-sectional view of a prior art flip-chip monolithic microwave integrated circuit.
Figure 2:
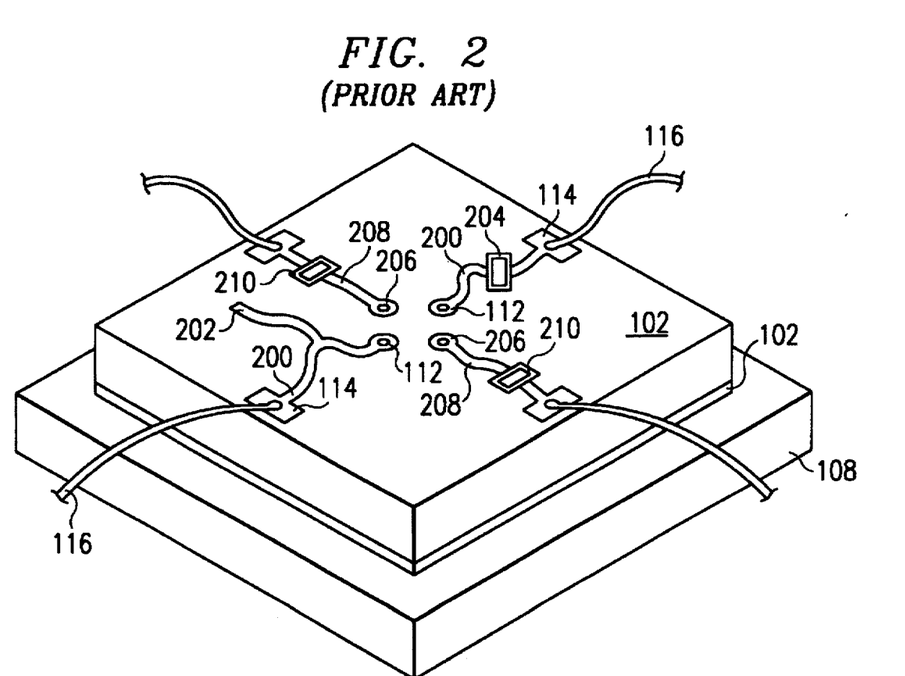
FIG. 2 is a perspective view of the prior art circuit shown in FIG. 1.

FIG. 1 shows a typical flip-chip implementation of a monolithic microwave integrated circuit (MMIC). An active device 100 is fabricated on a semiconductor substrate 102. In this case a vertical bipolar transistor is the active device shown, but the approach is also applicable to field-effect transistors. A common lead 104, typically linking several active devices, is formed in an airbridge plating process. In FIG. 1, the airbridge is shown connected to the emitter mesa 106 of bipolar transistor 100. In order to facilitate the removal of heat from transistor 100, the substrate 102 is flipped and mounted on heatsink 108. Input and output connections to the transistor are made from input/output pads 110/111 on the bottom side of the substrate through the substrate 102 by vias 112. Vias 112 are connected to input/output pads 114 on the top side of substrate 102, which are in turn connected by ball bonded wires 116 to external circuitry. The bipolar transistor 100, in addition to the emitter mesa 106, also comprises base contacts 118 and collector contacts 120, which are typically routed to the input 110 and output pads 111, respectively. Thus, after being amplified in transistor 100, a signal exiting at the collector contacts 120 must traverse the bottom surface of substrate 102 until it reaches output pad 111, where it exits the circuit through via 112 and bond wire 116. This tortuous routing of the output signals is the source of losses (resistive and mismatch) that degrade the performance of the circuit. FIG. 2 is a perspective view of the circuit in FIG. 1, showing input/output pads 114 connected to vias 112 by transmission lines 200. Passive elements such as tuning stubs 202 and blocking capacitors 204 may constitute impedance matching between circuitry external to the integrated circuit and the active device 100. Provisions for bias for the active device are also made on the top surface of the substrate 102 by vias 206, transmission lines 208 and bypass capacitors 210.

Though the prior art approach described here possesses advantages with respect to dissipating the heat generated by the active device, it also suffers from performance shortcomings due to the manner in which the output signal of the transistor is routed. The present invention intends to address this and other shortcomings of prior art integrated circuit approaches.

SUMMARY OF THE INVENTION

The present invention provides integrated circuits having active devices in contact with a heatsink for superior thermal impedance performance, and also provide transistors having terminals contacted on opposite surfaces of the substrate on which they are fabricated. This allows for a vertical current flow through the transistor with less resistance. The circuits also provide transistors having vertical current flow and reduced base-collector capacitance as a result of the removal of a portion of the material structure of which the transistor is fabricated.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Topside Transistor Contacts

Figure 3:
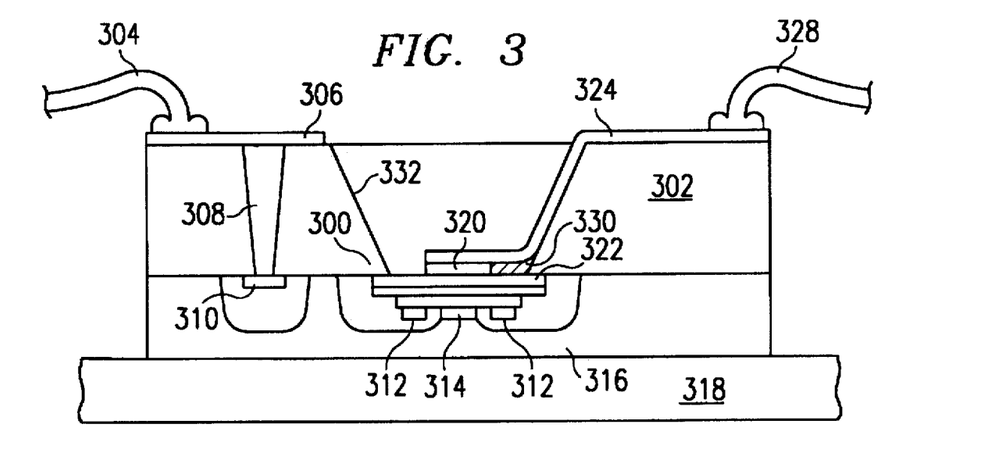
FIG. 3 is a cross-sectional view of a flip-chip integrated circuit with a contact made to the topside of the device in accordance with a first preferred embodiment of the invention.

FIG. 3 shows a first preferred embodiment flip-chip monolithic integrated circuit. An active device, in this case a vertical heterojunction bipolar transistor (HBT) 300, is fabricated on a semiconductor substrate 302, of gallium arsenide (GaAs), indium phosphide (IMP), or silicon (Si) for example. A signal on input bondwire 304 is transferred to input pad 310 through bondpad 306 and via 308. Input pad 310 is connected to base contact 312 by a transmission line (not shown). The emitter mesa 3 14 is typically connected by a common lead in the form of airbridge 316 to a heatsink 318. Heatsink 318 can be a high-thermal conductivity dielectric such as aluminum nitride (AIN) or beryllium oxide (BeO), or a metal such as gold-plated copper for example. The airbridge 316 serves as the thermal connection between the transistor 300 and the heatsink 318 through which the heat generated in the-transistor is dissipated.

Output from the transistor is taken from collector contact 320, which is in direct contact with the subcollector layer 322 of the transistor. Direct contact to the subcollector layer is made possible by etching away a portion of the substrate 302 from the top side to form a depression 332 and reveal the subcollector layer 322. Metallization, Ti/Pt/Au or AuGe for example, is then evaporated onto the subcollector to form contact 320. Interconnect metallization 324 is then deposited to connect the collector contact 320 to output bondpad 326. The output signal may then be transferred to external circuitry through output bondwire 328. A dielectric 330 such as polyimide or silicon nitride ($Si_3N_4$) can be used to planarize the interconnect metallization around the collector contact 320.

Figure 4:
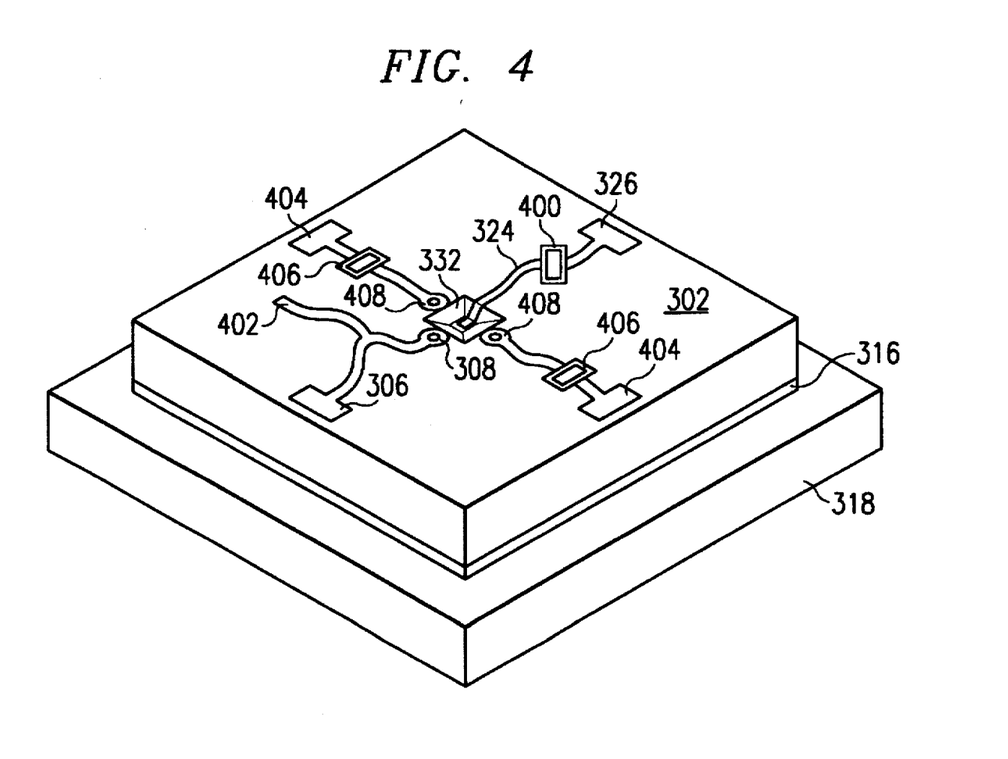
FIG. 4 is a perspective view of the circuit shown in FIG. 3.

FIG. 4 is a perspective view of the circuit of FIG. 3. Tuning elements such as blocking capacitors 400 and tuning stubs 402 may be incorporated into matching circuitry on the input and output of the transistor. Additionally, bias networks may also be incorporated onto the top surface of the substrate 302. Bondpads 404 and bypass capacitors 406 for example may be fabricated on the top surface. Vias 408 allow access from the top surface through the substrate 302 to the transistor 300.

Figure 5A:
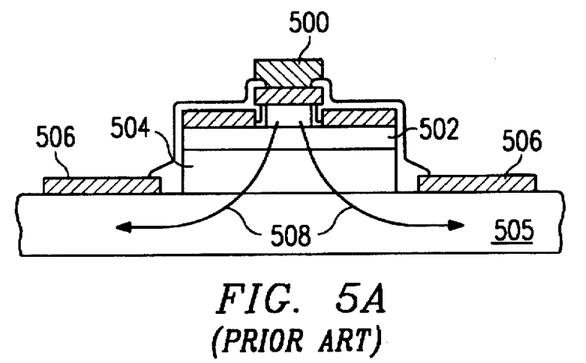
FIG. 5a is a cross-sectional view showing the current flow in a conventional heterojunction bipolar transistor.
Figure 5B:
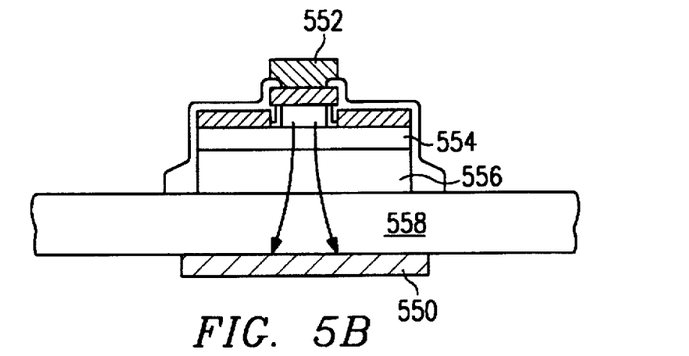
FIG. 5b is a cross-sectional view showing the current flow in a transistor in accordance with the first preferred embodiment of the invention.

FIGS. 5a and 5b illustrate one advantage of the first embodiment approach over conventional transistors. It may be appreciated that in the conventional transistor structure of FIG. 5a, current from the emitter terminal 500, through the base 502, through the collector layer 504, and to the collector contacts 506 follows the path denoted by 508. The First embodiment approach offers the advantage of having the collector contact 550 directly beneath the emitter 552. This makes possible a reduced current path from the emitter through the base, collector, and subcollector layers 554, 556, and 558, respectively. It is also important that the current flow in this embodiment is vertical, rather than lateral as shown in FIG. 5a. Lateral current flow is undesirable because of the recombination that can occur with traps present at the lateral surface of subcollector layer 505 between the base mesa and the collector contact 506 in FIG. 5a. Additional advantages of the first preferred embodiment approach include reduced path resistance (because of the shorter vertical path) and elimination of the need for airbridges. Conventional HBT structures require airbridges connecting the collector contacts 506. The structure shown in FIG. 5b eliminates this requirement because only a single collector contact 550 is used.

Reduced Parasitic Capacitance

Figure 6:
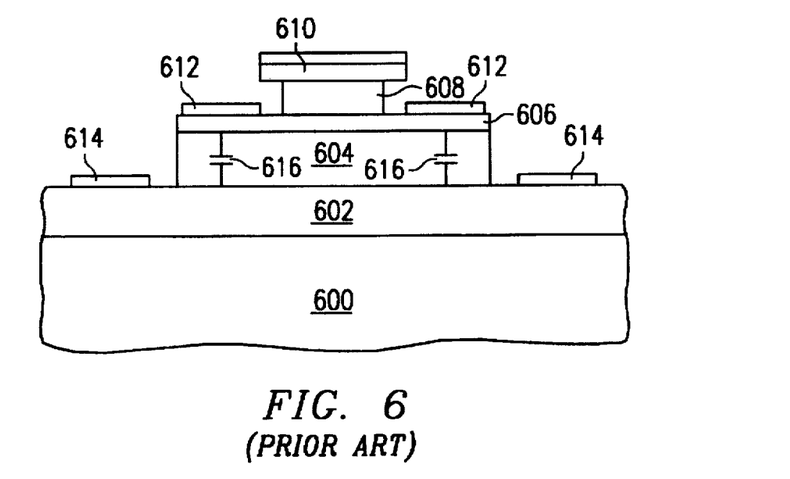
FIG. 6 is a cross-sectional view of a prior art heterojunction bipolar transistor.
Figure 7:
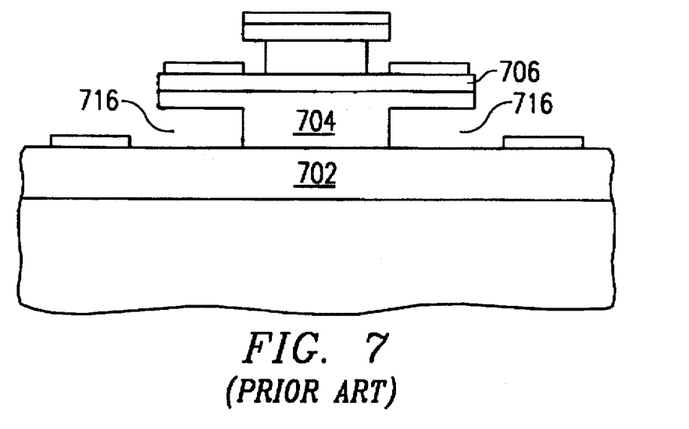
FIG. 7 is a cross-sectional view of a prior art heterojunction bipolar transistor having a portion of the collector layer removed from beneath the base layer.

FIG. 6 is a cross-sectional diagram of a conventional HBT structure comprising a substrate 600, a subcollector layer 602, a collector layer 604, a base layer 606, an emitter layer 608, an emitter contact 610, base contacts 612, and collector contacts 614. It should be noted that the emitter and collector layers may be reversed to produce a so-called "collector-up" structure rather than the "emitter-up" structure shown in FIG. 6. The transistor shown in FIG. 6 suffers from degraded performance due to the extrinsic base-collector parasitic capacitance (shown schematically by items 616) between the heavily doped base and subcollector layers 606 and 602, respectively. FIG. 7 is a prior art approach to minimizing the base-collector capacitance. It consists of simply removing portions of the collector layer 704. This creates a space 716 between the heavily doped base 706 and subcollector 702 layers. The space may be unfilled (air) or be filled with a low-permittivity dielectric. In either case, the parasitic base-collector capacitance is diminished, resulting in improved transistor performance.

Figure 8A:
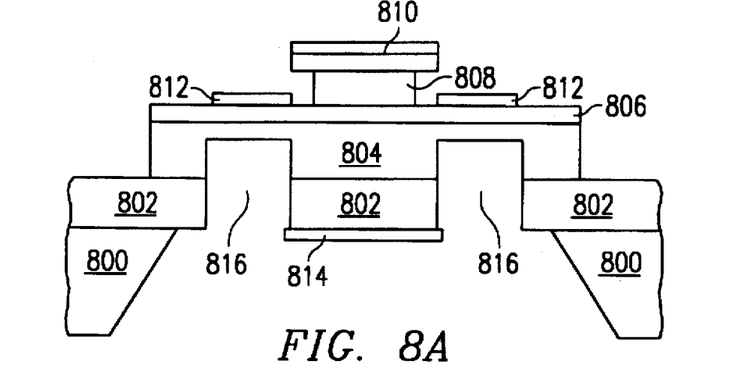
FIG. 8 is a cross-sectional view of a transistor providing contact to the topside of the substrate as well as a portion of the material structure removed for reduced base-collector capacitance in accordance with a second preferred embodiment of the invention.
Figure 8B:
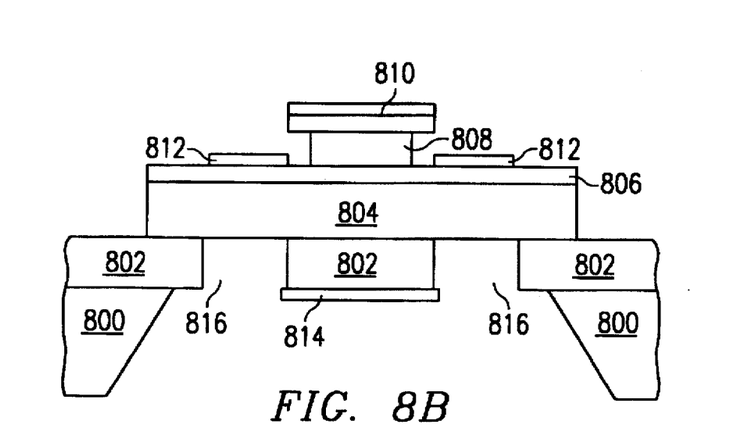

FIGS. 8a and 8b are cross-sectional diagrams of two versions of a second preferred embodiment structure. The structure shown in FIG. 8a comprises a substrate 800, a subcollector layer 802, a collector layer 804, a base layer 806, and emitter layer 808, an emitter contact 810, base contacts 812, and a collector contact 814. Substrate 800 is partially removed to expose subcollector layer 802. This embodiment is distinguished by removal of portions of the subcollector layer 802 and collector layer 804 from beneath the base layer 806 to produce recesses 816. This structure retains the advantageous vertical current path described hereinabove with respect to the first preferred embodiment, while also allowing for enhanced transistor performance (particularly gain) because of reduced base-collector capacitance. The structure shown in FIG. 8b varies from that of FIG. 8a in that the etch used to form the recesses 816 is stopped after the subcollector 802 is cleared. This approach accomplishes the goal of eliminating the heavily-doped subcollector that lies beneath the base contacts 812. The approach shown in FIG. 8b may also facilitate fabrication since an etch that is sensitive to doping concentration differences can be made to stop on the relatively lightly doped collector layer 804.

Figure 9:
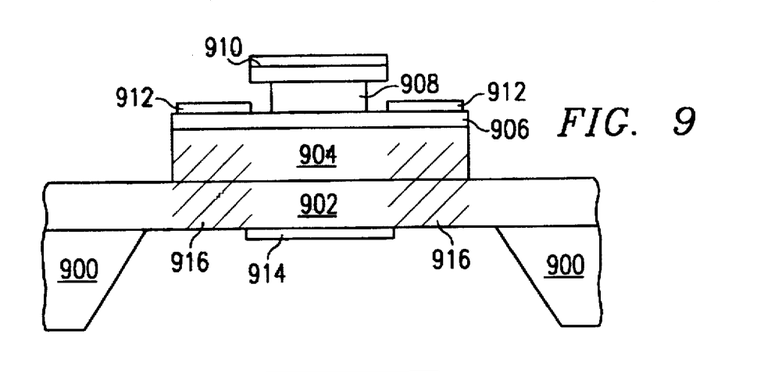
FIG. 9 is a cross-sectional view of a transistor providing contact to the topside of the substrate as well as a portion of the material structure rendering insulating through ion implantation in accordance with a third preferred embodiment of the invention.

FIG. 9 is a cross-sectional diagram of a third preferred embodiment structure. It is similar to the structure of the second preferred embodiment, except that instead of etching away portions of the subcollector and collector layers, ion implantation of protons or oxygen is performed on portions of the subcollector 902 and collector 904. This renders those portions of the subcollector 902 and collector 904 layers denoted 916 insulating. With the heavily doped portion of subcollector layer 902 that lies generally beneath the base contact 912 effectively eliminated, the base-collector capacitance of the transistor is greatly diminished. The depth of the implant is controlled by adjusting implant energy. The implant energy is usually in the range of approximately 100 KeV to approximately 200 KeV.

Multiple Finger Transistors

Figure 10A:
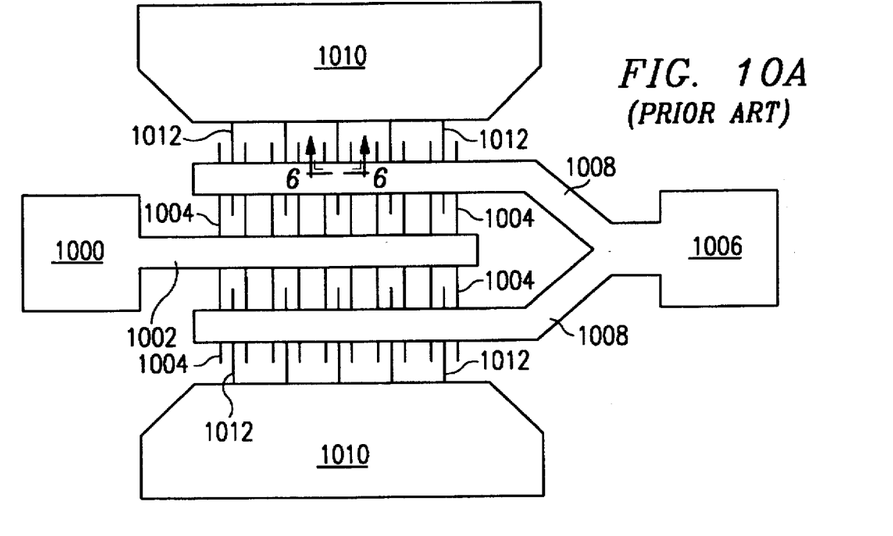
FIG. 10a is a plan view of a prior art "spider" or "horseshoe" transistor layout.
Figure 10B:
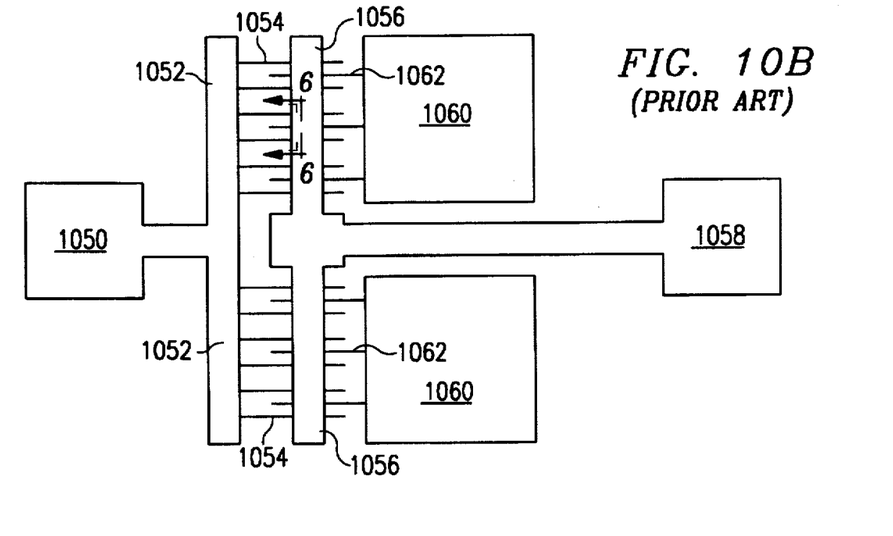
FIG. 10b is a plan view of a prior art "interdigitated" or "FET-like" transistor layout.

High-power transistors are typically fabricated to have a plurality of the unit transistors. The transistors shown in the preceding Figures are shown to possess a single emitter, base and collector. For high-power applications many of these unit transistors are connected in parallel. Examples of high-power transistor layouts are shown in FIGS. 10a and 10b. FIG. 10a is a common-emitter configuration comprising an input pad 1000 coupled to an input transmission line 1002 from which base contact fingers 1004 extend, an output pad 1006 coupled to an output transmission line 1008. Output transmission line 1008 is airbridged over each unit transistor (defined by a single emitter contact finger and a pair of base contact fingers) and is connected to a subcollector layer between each unit transistor. Emitter pads 1010 are connected to ground typically by a via hole through the substrate on which the transistor is fabricated. The emitter pads are connected to the unit transistors by emitter contact fingers 1012. Section lines show the relation of the conventional unit transistor shown in FIG. 6 to the circuit of FIG. 10a.

FIG. 10b is another layout scheme for a conventional high-power transistor. It comprises an input bond pad 1050 coupled to an input transmission line 1052 from which base contact fingers 1054 extend. As in the layout of FIG. 10a, the collectors of the unit transistors are connected to a common output transmission line 1056, which is in turn coupled to an output bondpad 1058. Emitter pads 1060 are connected to the unit transistors by emitter contact fingers 1062. Section lines show the relation of the unit transistor shown in FIG. 6 to the layout of FIG. 10b.

Figure 11:
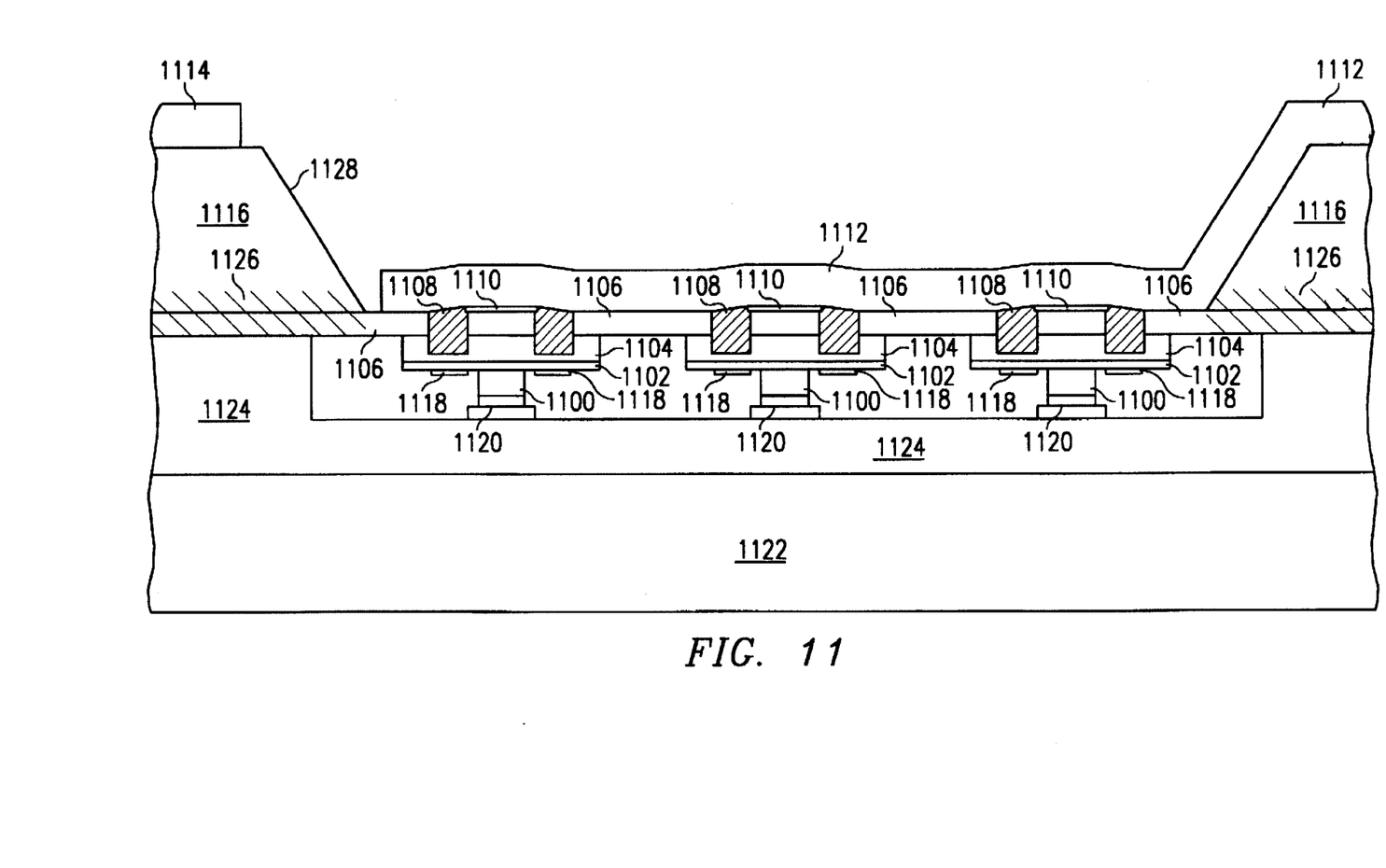
FIG. 11 is a cross-sectional diagram of a multi-finger transistor circuit in accordance with a fourth preferred embodiment of the invention.

FIG. 11 is a cross-sectional diagram of a fourth embodiment transistor. The structure comprises three unit transistors, each of which includes an emitter layer 1100, a base layer 1102, a collector layer 1104, and a shared subcollector layer 1106. Each of the unit transistors has a portion of the subcollector 1106 and collector 1104 layers etched away in a manner similar to that described above for the unit transistor of FIG. 8. The recessed regions 1108 may be filled with a planarizing dielectric such as polyimide or silicon nitride ($Si_3N_4$), or may left unfilled. Collector contacts 1110 are connected by a common output transmission line 1112 to an output bondpad (not shown). Input transmission line 1114 is coupled by a via hole (not shown) through substrate 1116 and is in turn connected to base contacts 1118. Emitter contacts 1120 are connected to one another and to a heatsink 1122 by plated airbridge 1124. Heavily doped subcollector layer 1106 is typically subjected to ion implantation to render it insulating in regions 1126 away from the unit transistors. Topside access to the collector contacts 1110 and subcollector layer 1106 is obtained by etching a "bathtub" recess 1128 in the substrate 1116.

Figure 12A:
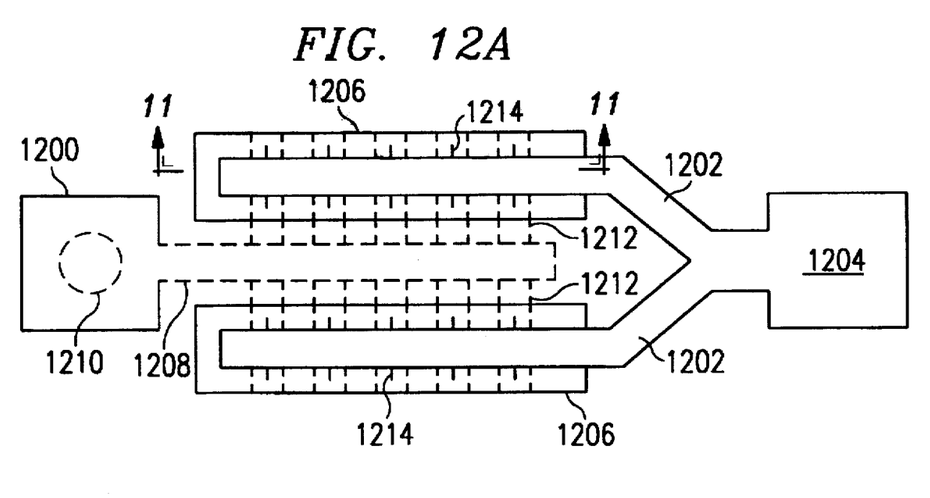
FIGS. 12a and 12b are plan views of transistor layouts incorporating the structure configured in accordance with the fourth preferred embodiment of the invention shown in FIG. 11.

FIG. 12a is a plan view of a transistor layout incorporating the fourth preferred embodiment structure. The majority of the layout is on the bottom surface of the substrate and is hence shown in dashed lines. The exceptions are the input bondpad 1200 and the output transmission line 1202 and output bondpad 1204. Access to the subcollector layer of the unit transistors is obtained by etching bathtub recess 1206. Output transmission line 1202 transitions from the topside of the substrate to the bottom of the recess as shown in FIG. 11 by out/put line 1112. Section lines show the relation of the fourth preferred embodiment structure shown in FIG. 11 to that of the layout of FIG. 12a. It should be noted that only three unit transistors were shown in FIG. 11 for the sake of clarity, whereas five unit transistors per side are shown in the layout of FIG. 12a. Input bondpad 1200 is coupled to input transmission line 1208 by a via hole 1210 through the substrate. Base contact fingers 1212 extend from input transmission line 1208. Emitter contacts 1214 are connected to one another and to a heatsink (hidden beneath the layout) by an airbridge (also hidden in this plan view).

Figure 12B:
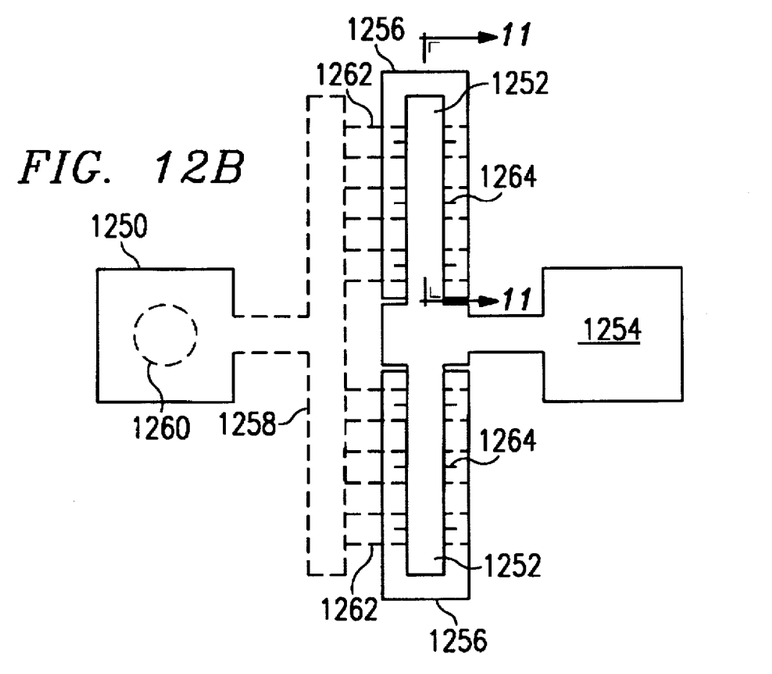

FIG. 12b is another layout incorporating the fourth preferred embodiment structure. The majority of the layout lies on the bottom side of the substrate, the exceptions are the input pad 1250, the output transmission line 1252 and the output bondpad 1254. Section lines show the relation of the fourth preferred embodiment structure shown in FIG. 11 to that of the layout of FIG. 12b. Access to the subcollector layer of the unit transistors is obtained by etching bathtub recess 1256. Input pad 1250 is coupled to input transmission line 1258 by a via hole 1260 through the substrate. Base contact fingers 1262 extend from input transmission line 1258. Emitter contacts 1264 are connected to one another and to a heatsink (hidden beneath the layout) by an airbridge (also hidden in this plan view).

Fabrication Techniques

The embodiments described herein may be fabricated using the process described as follows. It should be noted that FIGS. 13a–e show only one unit transistor. The techniques described here are easily adapted to forming the multiple unit transistor devices used for high-power applications. The unit transistors are formed using conventional techniques on a material structure that consists of, for example, a 625 μm substrate 1300, typically of gallium arsenide (GaAs), indium phosphide (InP), or other semi-insulating substrate material; an epitaxial GaAs subcollector layer 1302 n-doped with silicon to approximately $10 \times 10^{17}$ cm$^{-3}$ and having a thickness of approximately 1500 nm; an epitaxial GaAs collector layer 1304 n-doped with silicon to approximately $0.1 \times 10^{17}$ cm$^{-3}$ and having a thickness of approximately 1000 nm; an epitaxial GaAs base layer 1306 p-doped with carbon to approximately $300 \times 10^{17}$ cm$^{-3}$ and having a thickness of approximately 80 nm; an epitaxial $Al_{0.3}Ga_{0.7}As$ emitter layer 1308 n-doped to approximately $2 \times 10^{17}$ cm$^{-3}$ and having a thickness of approximately 100 nm; and an epitaxial GaAs cap layer 1310 n-doped to approximately 15×10cm$^{-3}$ and having a thickness of approximately 200 nm. Protons or oxygen is implanted to create crystal damage and thereby render semi-insulating all of the areas 1312 outside of an active area. Emitter contacts consist of a metal composite which includes germanium (Ge), nickel (Ni), and gold (Au). Emitter mesa 1316 and base mesa 1318 are formed with a combination wet and dry etching techniques. Base contacts 1320 are typically a composite of titanium (Ti), platinum (Pt) and gold (Au).

Figure 13A:
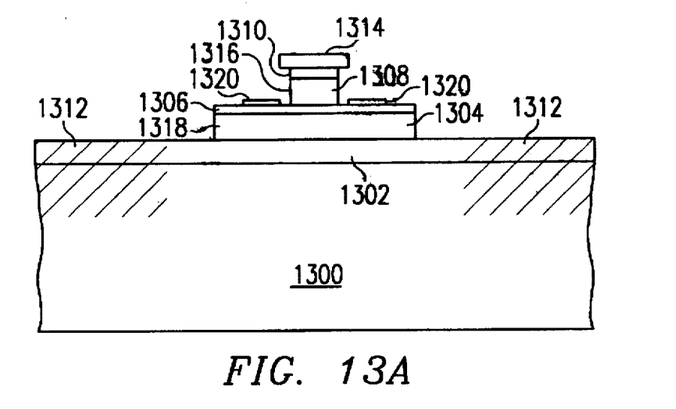
FIGS. 13a–13e are cross-sectional views of a transistor structure at various stages in a process of fabrication.
Figure 13B:
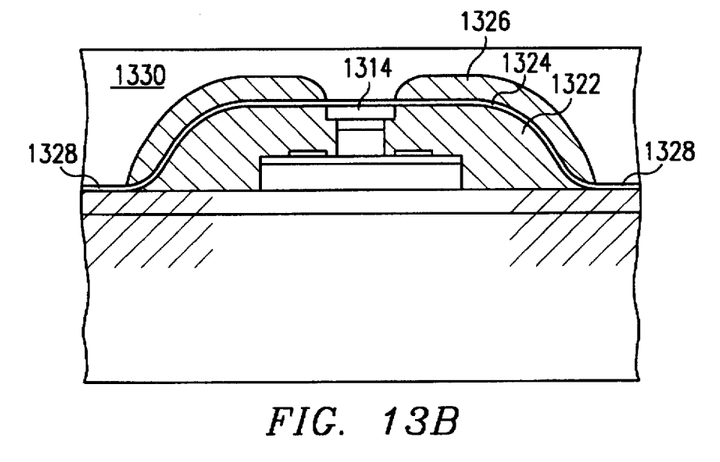

In FIG. 13b an airbridge contacting emitter contact 1314 is fabricated by first spinning on and patterning photoresist 1322 to reveal the emitter contact 1314. Photoresist 1322 is baked and then a thin layer of Ti/Au (100 nm) (not shown) is evaporated over the photoresist. A thin (50 nm) layer of gold 1324 is then sputtered over the Ti/Au layer. The thin layer of gold serves as the basis for airbridge plating. A second layer of photoresist 1326 is applied and patterned to expose the gold layer 1324 over emitter contact 1314 and areas 1328 away from the active area. Gold is then electroplated to a thickness of roughly 3 μm using the thin metal layer 1324 as the initiating layer. Photoresist 1322 and 1326 along with thin gold layer 1324 is then stripped. Further plating to a thickness of approximately 10 μm follows. This forms airbridge 1330 connecting the emitter contact 1314 with other circuitry on the substrate.

Figure 13C:
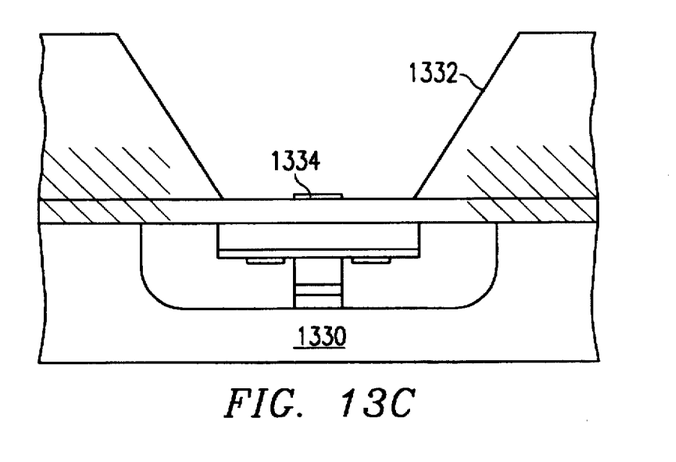

The structure is then flipped and mounted with the topside down on a quartz carrier using a layer of wax. The wafer may be thinned (if starting with a substrate of thickness in excess of 100 to 150 µm) and vias etched. The bathtub recess 1332 may be formed using a reactive ion etching process similar to that used for forming conventional via holes. The etch depth can be controlled through a simple timing technique, or thin layers of an etch stop material such as AlGaAs or InGaAs (not shown) can be grown in the material structure to facilitate stopping the etch. Another technique is to etch in timed intervals between which a physical measurement of the etch depth is made. Yet another technique is to etch in timed intervals and monitor the current between probes placed on the etched surface. The difference between a heavily doped layer such as a subcollector, and a lightly doped layer like a collector is readily discernible using this technique. Collector contact 1334 is then formed of a composition such as Ge/Ni/Au, for example, by patterning photoresist to expose the desired contact region and then lifting off the excess metal after evaporation. Input and output lines may also be formed on the topside of the substrate at this point by evaporating a fast metal line of Ti/Pt/Au for example, and thud plating with Au.

Figure 13D:
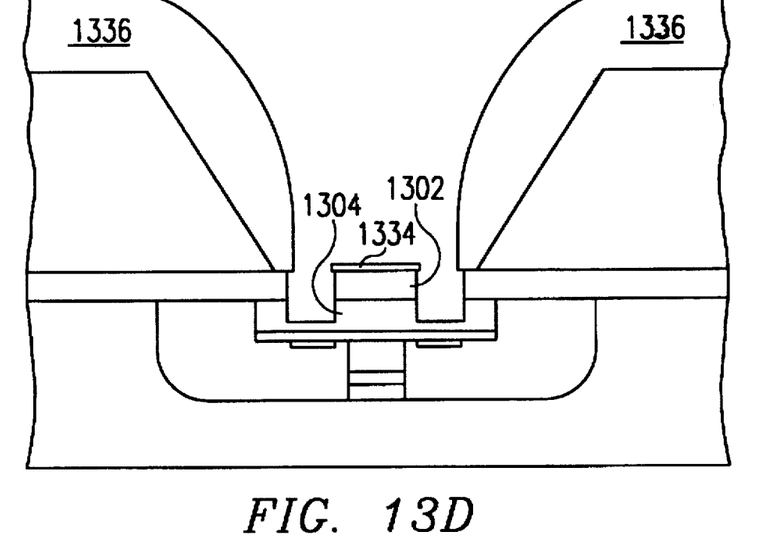
Figure 13E:
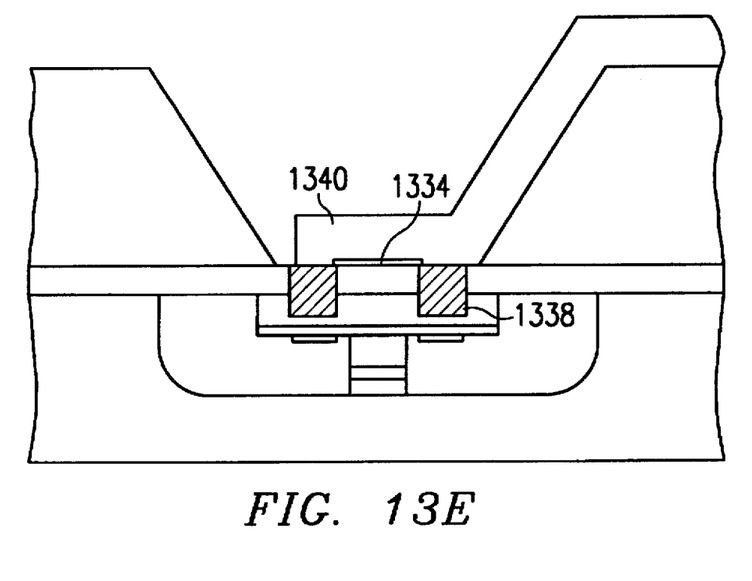

If the recesses in the subcollector and collector layers for reducing base-collector capacitance are desired, a layer of photoresist 1336 may be applied and patterned to expose the intended recess region. A reactive ion etching technique using $CCl_2F_e$, for example, is then used to remove portions of the subcollector and collector layers as shown in FIG. 13d. The etch depth may be controlled in any of the ways discussed above for the "bathtub" etch, e.g. etch stop layers or timed etch techniques. The photoresist is then stripped. A planarizing dielectric 1338 such as polyimide or $Si_3N_4$, may then be deposited to fill the recesses. Input and output lines 1340 may then be formed using conventional techniques to connect the collector contact 1334 to external circuitry.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though the transistor described were "emitter-up", it may be appreciated that the approaches described herein apply equally as well to "collector-up" transistor configurations. It is therefore intended that the appended claims encompass any such modifications or embodiments.

What is claimed is:

1. A method of forming an integrated circuit, comprising the steps of:

providing a substrate having a material structure including a subcollector layer adjacent said substrate, a collector layer adjacent said subcollector layer, a base layer adjacent said collector layer, and a emitter layer adjacent said base layer, said substrate having a top surface and a bottom surface;

forming at least one transistor at said bottom surface, said transistor having a first terminal contact on said subcollector layer in a recess at said top surface and accessible from said top surface;

forming a second terminal contact accessible from said bottom surface;

forming said first terminal contact to be substantially vertically aligned with said second terminal contact; and attaching said second terminal to a heatsink.

2. The method of claim 1, further comprising the steps of forming interconnect metallization over said top surface.

3. The method of claim 1, further comprising forming recesses on opposite sides of said first terminal contact by removing portions of said subcollector layer.

4. The method of claim 3, further comprising the step of forming third terminal contacts at said bottom surface, said recesses being substantially aligned with said third terminal contacts along a plane perpendicular to said substrate.

5. The method of claim 1, further comprising ion implanting regions in said subcollector layer and said collector layer on opposite sides of said first terminal contact to render said regions semi-insulating.

6. The method of claim 5, further comprising the step of forming third terminal contacts at said bottom surface, said ion-implanted regions being substantially aligned with said third terminal contacts along a plane perpendicular to said substrate.

\* \* \* \* \*